United States Patent
Martinez Vela

(10) Patent No.: US 10,239,261 B2
(45) Date of Patent: Mar. 26, 2019

(54) HIGH FREQUENCY OSCILLATOR, HIGH FREQUENCY WELDING SYSTEM AND METHOD FOR CONTROLLING THE FREQUENCY USING SAID TYPE OF HIGH FREQUENCY OSCILLATOR

(71) Applicant: KIEFEL GmbH, Freilassing (DE)

(72) Inventor: Fernando Martinez Vela, Barcelona (ES)

(73) Assignee: KIEFEL GmbH (DE)

(*) Notice: Subject to any disclaimer, the term of this patent is extended or adjusted under 35 U.S.C. 154(b) by 244 days.

(21) Appl. No.: 14/787,309

(22) PCT Filed: Apr. 8, 2014

(86) PCT No.: PCT/DE2014/000176
§ 371 (c)(1),
(2) Date: Oct. 27, 2015

(87) PCT Pub. No.: WO2014/187439
PCT Pub. Date: Nov. 27, 2014

(65) Prior Publication Data
US 2016/0067915 A1   Mar. 10, 2016

(30) Foreign Application Priority Data

May 24, 2013   (DE) .................. 10 2013 008 730
Dec. 18, 2013  (DE) .................. 10 2013 021 062

(51) Int. Cl.
*B32B 37/00*   (2006.01)
*B29C 65/00*   (2006.01)
(Continued)

(52) U.S. Cl.
CPC .......... *B29C 66/9512* (2013.01); *B29C 65/08* (2013.01); *H03B 1/02* (2013.01);
(Continued)

(58) Field of Classification Search
CPC .. B29C 65/14; H03B 1/02; H03B 5/08; H03B 5/1256; H03J 3/16; H03J 3/20; H03J 3/22
(Continued)

(56) References Cited

U.S. PATENT DOCUMENTS 3,654,546 A   4/1972  Wanlass
4,112,347 A * 9/1978  Moerman .................. G05F 1/38
                                                    323/250

(Continued)

FOREIGN PATENT DOCUMENTS

CN   201 227 866 Y   4/2009
CN   101919012 A    12/2010
(Continued)

OTHER PUBLICATIONS

Chinese Office Action in CN 201480025570.4, dated Nov. 1, 2017.
(Continued)

*Primary Examiner* — James D Sells
(74) *Attorney, Agent, or Firm* — Tarolli, Sundheim, Covell & Tummino LLP

(57) ABSTRACT

A high-frequency oscillator includes an electric resonant circuit, and a high-frequency welding system and a method for controlling the frequency uses a high-frequency oscillator, in particular in a high-frequency welding system. The electric resonant circuit includes at least one electronic component having an inductance and at least one capacitor having a capacitance. At least one additional magnetic coil is associated with the electronic component and can electronically influence the inductance of the electronic component.

7 Claims, 1 Drawing Sheet

(51) Int. Cl.
*H03B 1/02* (2006.01)
*H03B 5/08* (2006.01)
*H03J 3/16* (2006.01)
*H03J 3/20* (2006.01)
*H03B 5/12* (2006.01)
*H03J 3/22* (2006.01)
*B29C 65/08* (2006.01)
*B29C 65/04* (2006.01)
*H01P 1/217* (2006.01)

(52) U.S. Cl.
CPC ............. *H03B 5/08* (2013.01); *H03B 5/1256* (2013.01); *H03J 3/16* (2013.01); *H03J 3/20* (2013.01); *H03J 3/22* (2013.01); *B29C 65/04* (2013.01); *B29C 66/95* (2013.01); *H01P 1/217* (2013.01)

(58) Field of Classification Search
USPC ....................................................... 156/379.6
See application file for complete search history.

(56) References Cited

U.S. PATENT DOCUMENTS

| | | | |
|---|---|---|---|
| 4,371,768 A | 2/1983 | Pozna | |
| 4,791,542 A * | 12/1988 | Piaskowski | H02M 7/53832 323/235 |
| 7,889,026 B2 | 2/2011 | Parsche et al. | |
| 8,044,732 B2 | 10/2011 | Kossel et al. | |
| 9,820,339 B2 | 11/2017 | Matsen et al. | |
| 2007/0146088 A1 | 6/2007 | Arai et al. | |
| 2009/0174493 A1 | 7/2009 | Jeon et al. | |
| 2009/0174501 A1 | 7/2009 | Parsche et al. | |
| 2009/0201097 A1 | 8/2009 | Kossel et al. | |

FOREIGN PATENT DOCUMENTS

| | | |
|---|---|---|
| CN | 102891539 A1 | 1/2013 |
| CN | 103108422 A | 5/2013 |
| DE | 738 825 A | 9/1943 |
| DE | 28 11 3019 A1 | 10/1978 |
| DE | 30 40 028 C2 | 5/1981 |
| DE | 10 2004 049060 A1 | 6/2005 |
| EP | 1 216 760 A2 | 6/2002 |
| EP | 2 575 410 A2 | 4/2013 |
| GB | 490 058 A | 8/1938 |
| GB | 1 597 873 A | 9/1981 |

OTHER PUBLICATIONS

International Search Report of PCT/DE2014/000176, dated Oct. 22, 2014.
German Search Report in 10 2014 003 868.8, dated May 14, 2014, with an English translation of relevant parts.
Kormanyos B: "Magnetic Fields Tune Oscillator," EDN Electrical Design News. (Texas Instrument), Reed Business Information, Highlands Ranch, Co, US, vol. 35, No. 4, Feb. 15, 1990, pp. 190-192.
Dunn J: "AGC Gives Top Tuning Range," Electronic Design, Penton Media, Cleveland, OH, US, vol. 39, No. 17,, Sep. 12, 1991, p. 141.

* cited by examiner

HIGH FREQUENCY OSCILLATOR, HIGH FREQUENCY WELDING SYSTEM AND METHOD FOR CONTROLLING THE FREQUENCY USING SAID TYPE OF HIGH FREQUENCY OSCILLATOR

CROSS REFERENCE TO RELATED APPLICATIONS

This application is the National Stage of PCT/DE2014/000176 filed on Apr. 8, 2014, which claims priority under 35 U.S.C. § 119 of German Application Nos. 10 2013 008 730.9 filed on May 24, 2013, and 10 2013 021 062.3 filed on Dec. 18, 2013, the disclosures of which are incorporated by reference. The international application under PCT article 21(2) was not published in English.

The invention relates to a high-frequency oscillator. The invention further relates to a high-frequency welding system for high frequency welding of plastic films with at least one high frequency oscillator of said type and to a method for controlling the frequency using said type of high frequency oscillator.

For high frequency welding of plastics, more specifically plastic films, high frequency welding systems are customarily used. In the process, the plastics are passed between electrodes and heated up by means of a high frequency electromagnetic alternating field. The plastic films are thus welded together at their points of contact. During the process, a work frequency is set by means of high frequency oscillators that is as stable as possible and lies for example in the range of 25 to 30 megahertz.

The high frequency oscillators used to that end are built as so-called solid-state generators and therefore do not have vacuum tubes for frequency conversion but semi-conductor components for converting the direct power into a high frequency alternating power. The high frequency oscillators operate virtually wear-free and are relatively insensitive to mechanical stresses.

However, these high frequency oscillators have relatively low frequency stability, i.e. a low quality factor. More specifically in case of a change of load, the output frequency may thus be detuned. As a consequence, the oscillator frequency changes more than is authorized by legislative authorities. Accordingly, it is necessary to control the frequency of the high frequency oscillator.

Usually, this control is achieved by mechanically influencing the inductance of the corresponding electronic component of the electric resonant circuit, which, as a rule, is at least formed by a coil. In the process, a ferromagnetic core is for example moved more or less far inside the coil, or the generated magnetic field is influenced by way of a highly electrically conductive core. The inductance can thus be controlled by way of a corresponding mechanical system driven by an electric motor and the resonant circuit can be set to a target frequency even in case of changes in the load.

However, in case of rapid load changes, the frequency correction cannot happen at sufficiently short notice. In particular, load changes that are shorter than 300 milliseconds cannot be corrected, the control being additionally complicated by a relatively strong tendency to overshoot. Furthermore, the necessary mechanical system is subject to wear.

The problem underlying the invention is thus to eliminate the disadvantages of the prior art and in particular to provide a possibility allowing for wear-free frequency control having a high control accuracy even in case of rapid load changes.

In a high frequency oscillator with an electric resonant circuit having at least one electronic component having an inductance and at least one capacitor, it is provided according to the invention that at least one magnetic coil is associated with the electronic component and can electronically influence the inductance of the electronic component.

The inductance is thus not influenced by mechanically moving a ferromagnetic core or by displacing the magnetic field but by electronically influencing it. In the process, a magnetic field is generated with at least one magnetic coil, so that the inductance of the electronic component is influenced. This allows for a very high-speed frequency correction even in case of rapid load changes, the inductance being influenced without mechanical displacement and thus without mechanical wear. Rather, the resonant circuit is tuned magnetically. This results in a very precise frequency control without noticeable overshoot tendency. As a whole, the result is high control accuracy.

It is preferable that the magnetic coil be integrated in a control circuit for controlling the frequency of the high frequency oscillator. The magnetic coil is then more specifically operated with a direct current. The inductance can be continuously adjusted through a suitable power supply. The maximum inductance of the electronic component is used when the power to the magnetic coil is cut off. In contrast, in order to operate the high frequency oscillator at the highest possible frequency, the magnetic coil is supplied with maximum power and the inductance is thus minimized. Thus, by appropriately actuating the magnetic coil, the frequency of the electric resonant circuit of the high frequency oscillator can be sensitively controlled.

The magnetic coil is particularly preferably wound from a ring of ferromagnetic material. The maximum current that can be fed through the magnetic coil then depends on the moment at which the ring of ferromagnetic material reaches saturation.

In a preferred development, the electronic component has at least one copper tube that is passed through the magnetic coil. In particular, several copper tubes are provided that are passed through one or several magnetic coils. This allows controlling higher power outputs. Designing the electronic component with one or several copper tubes results in a high frequency coil of corresponding quality. This also allows converting higher power outputs.

In a preferred embodiment, the high frequency oscillator is designed as a high frequency generator. Thereby it is particularly suited for providing a stable high frequency alternating voltage such as required for example by high frequency welding systems.

The afore-mentioned problem is solved by a high frequency welding system for high frequency welding of plastics with at least one high frequency oscillator according to the invention, in that the high frequency oscillator is integrated in a high frequency circuit and/or a load circuit of the high frequency welding system. A high frequency alternating voltage is transferred by the high frequency circuit to the load circuit, and transmitted from there to the electrode and counter electrode. The high frequency oscillator according to the invention then allows a very precise control of the output frequency of the high frequency circuit, on the one hand, but also of the resonance frequency or impedance in the load circuit. This results in good frequency stabilization in the high frequency circuit, the high frequency oscillator operating as a high frequency generator. A good resonant circuit correction and/or power output control as well as a precise impedance control can take place in the load circuit.

The high frequency welding system preferably has a higher-level controller for tuning the frequency in the high frequency circuit and for tuning the resonance frequency in the load circuit. Thereby, high control accuracy is achievable. That way, an optimal operating frequency of the load circuit can be set, which, where applicable, may even be carried out by way of an automatic search run, during which the system is operated at various output frequencies by correspondingly gradually changing the inductance of the high frequency oscillator disposed in the high frequency circuit until an optimum is reached.

The afore-mentioned problem is also solved by a method for controlling the frequency using a high frequency oscillator according to one aspect of the invention, more specifically in a high frequency welding system according to another aspect of the invention, in that a frequency of the high frequency oscillator is controlled wear-free by electronically adapting an inductance. Since no moving parts are required for influencing the inductance, no wear can occur. In addition there is no need to fear an overshoot caused by the inertia of mechanical components. Thus a very short reaction time of less than 5 milliseconds is achievable and therefore a very fast frequency control.

The inductance is preferably adjusted by applying a direct current to magnetic coils. This makes it possible to very quickly and very sensitively influence the inductance and thus the output frequency of the high frequency oscillator.

An impedance of the electric resonant circuit is preferably adjusted by adapting the inductance. As a result, the range of applications of the high frequency oscillator is expanded; it can be used for example in the load circuit.

In a preferred development, the inductance is gradually or continuously changed in an automatic search run until an optimum frequency is obtained in the load circuit. Thus, after completion of the automatic search run, the high frequency welding system can be operated with an optimal frequency in the load circuit. Very good welding results are thus reliably and reproducibly achievable.

In an example not shown, the electronic adaptation of the inductance is used for tuning the load circuit of amplifiers. If, for example, an amplifier delivers an output impedance of 50 Ohm, it is accompanied by a real resistance in the load circuit of 50 Ohm. In the prior art, tuning the amplifier to the load circuit is done with adjustable vacuum variable capacitors that are adjusted by means of stepper motors. Instead of capacitive tuning, the tuning can also be carried out inductively in accordance with the invention.

In the following, the invention will be described in more detailed based on an exemplary embodiment with reference to the drawings. In the drawings.

Figure 1:
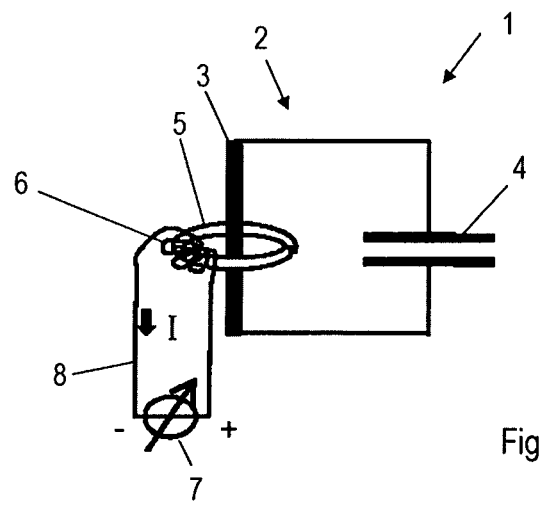
FIG. 1 shows a schematic diagram of the high frequency oscillator.

FIG. 1 shows a schematic diagram of a high frequency oscillator 1 comprising an electric resonant circuit 2. In the electric resonant circuit 2, the electronic component 3 that provides an inductance L is a coil. In addition, the resonant circuit comprises a capacitor 4 having a capacitance C. In its structural principle, the resonant circuit is a conventional LC resonant circuit. In this example, the electronic component 3 is designed as a coil with at least one copper tube. However, it is also possible to provide several coils as well as several capacitors.

The electronic component 3 is passed through a ring 5 made of a ferromagnetic material, around which a magnetic coil 6 is wound. The magnetic coil 6 is integrated in a control circuit 8 that comprises a controllable direct current source 7.

Through appropriate actuation of the direct current source 7, the magnetic coil 6 generates a magnetic field, which is superimposed on the field of the electronic component 3 and thus influences the inductance of the electronic component 3. When no current flows through the control circuit 8, there is no interference by the magnetic coil 6, so that the inductance of the electronic component 3 is at its maximum. The frequency of the electric resonant circuit 2 is thus minimal. When the control circuit 8 is operated in such a manner that the ring made of a ferromagnetic material is brought to saturation, a correspondingly strong magnetic field is generated by the magnetic coil 6 and the inductance of the electronic component 3 is reduced as far as possible. A frequency of the electric resonant circuit 2 is thus very high. Between these two extremes, the inductance of the electronic component 3 and thus the resonance frequency of the resonant circuit 2 can be adjusted sensitively and very quickly through appropriate actuation of the direct current source 7.

Figure 2:
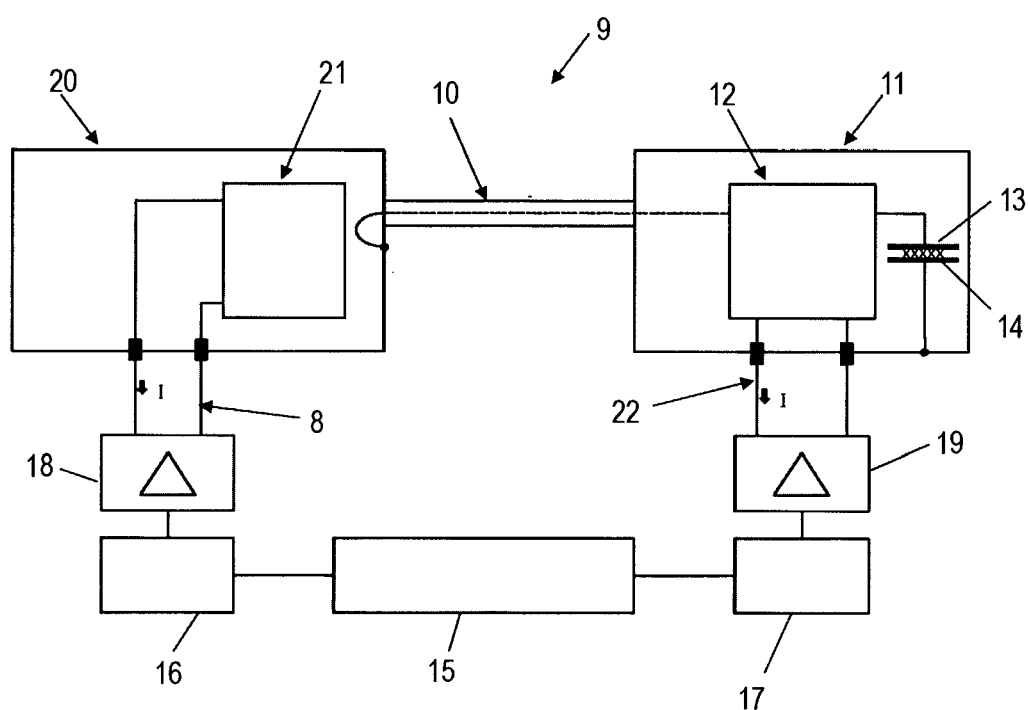
FIG. 2 shows a schematic diagram of a high frequency welding system.

FIG. 2 shows a schematic representation of a high frequency welding system 9 for high frequency welding of plastic films, wherein a high frequency output oscillation is provided in a high frequency circuit 21 by means of a first high frequency oscillator according to the invention in a high frequency generator 20 and transmitted via a coaxial connection 10 to a load circuit 11.

In the load circuit 11, there is provided a magnetic resonant circuit 12, via which an electrode 13 and a counter electrode 14 are supplied with an appropriate high frequency voltage. The material to be welded is passed between the electrode 13 and the counter electrode 14. In the process, it is necessary to tune the system to the pending load, which is influenced for example by the thickness of the material to be welded. To this end, a second magnetically tunable resonant circuit according to the invention is provided in 12, which comprises a means for electronically influencing its inductance such as the high frequency oscillator.

A higher-level controller 15 is provided for tuning the frequency in the high frequency circuit 21 by means of the first high frequency oscillator according to the invention and for adjusting a resonance frequency in the load circuit 11 by means of the second magnetic resonant circuit. Control signals of the higher-level controller are transmitted via suitable driver elements 16, 17 and amplifiers 18, 19 to the control circuit 8 for frequency control of the first high frequency oscillator in the high frequency circuit 21, respectively to a corresponding control circuit 22 of the second magnetic resonant circuit disposed in the load circuit 11. Thereby a complete control of the high frequency welding system is possible, thus allowing an optimal adjustment of the operating point.

The design according to the invention allows for a good frequency correction in the high frequency oscillator even in case of rapid load changes. It is not subject to mechanical wear and has no tendency to overshoot, since it does not have any mechanically movable components. Rather, the frequency of the resonant circuit of the oscillator is changed purely electronically by appropriately influencing its inductance. This is done by applying a direct voltage to at least one additional magnetic coil, which correspondingly influences the inductance of the electronic component provided in the resonant circuit.

Thus the inductance and therefore the frequency in the resonant circuit change depending on the actuation of the additional magnetic coil. The high frequency oscillator according to the invention can be used similarly for impedance control, respectively control of the resonance frequency in the load circuit of a high frequency welding system. Very high control accuracy and high control speed are also achievable there. A potentially higher power consumption can lead to a temperature increase, which can be contained by additional cooling for example by means of air or water. As a whole, this results in very high frequency stability and a good tuning of the load circuit, an automatic search run for the optimal operation frequency of the load circuit being also possible. The correction of the resonant circuit frequency is carried out without wear and electronically. An adjustment of the impedance can also be carried out electronically. In the process, the respective frequency of the oscillator is electronically adjusted by magnetic coils.

The invention is not limited to the shown exemplary embodiments and can be modified in numerous ways. For example, it is possible to use several magnetic coils with respectively one ring of ferromagnetic material. It is also possible to use the high frequency oscillator according to the invention not only as a high frequency generator for generating high frequency voltages or currents, but also for example as sensitive high pass or low pass filters.

The invention claimed is:

1. A high frequency oscillator (1) with an electric resonant circuit (2) comprising at least one electronic component (3) having an inductance and at least one capacitor (4), wherein at least one magnetic coil (6) is associated with the electronic component (3) and with which the inductance of the electronic component is electronically influenceable, and wherein the electronic component (3) has at least one copper tube that is passed through the magnetic coil (6).

2. The high frequency oscillator according to claim 1, wherein the magnetic coil (6) is integrated into a control circuit (8) for controlling the frequency of the high frequency oscillator (1).

3. The high frequency oscillator according to claim 1, wherein the magnetic coil (6) is operable with a direct current.

4. The high frequency oscillator according to claim 1, wherein the magnetic coil (6) is wound on a ring (5) of ferromagnetic material.

5. The high frequency oscillator according to claim 1, wherein it is designed as a high frequency generator or as a high frequency filter.

6. A high frequency welding system for high frequency welding of plastics with at least one high frequency oscillator (1) according to claim 1, wherein the high frequency oscillator (1) is integrated into a high frequency circuit (21) and/or a load circuit (11) of the high frequency welding system (9).

7. The high frequency welding system according to claim 6, wherein it has a higher-level controller (15) for tuning the frequency in the high frequency circuit (21) and/or for tuning the resonance frequency in the load circuit (11).

* * * * *